(12) United States Patent
Lou et al.

(10) Patent No.: US 7,576,553 B2
(45) Date of Patent: Aug. 18, 2009

(54) INTEGRATED CIRCUIT PROBING APPARATUS HAVING A TEMPERATURE-ADJUSTING MECHANISM

(75) Inventors: Choon-Leong Lou, Singapore (SG); Li Min Wang, Taichung (TW)

(73) Assignee: Star Technologies Inc., Jhudong Township, Hsinchu County (TW)

(*) Notice: Subject to any disclaimer, the term of this patent is extended or adjusted under 35 U.S.C. 154(b) by 0 days.

(21) Appl. No.: 11/609,558

(22) Filed: Dec. 12, 2006

(65) Prior Publication Data
US 2008/0048700 A1   Feb. 28, 2008

(30) Foreign Application Priority Data
Aug. 25, 2006  (TW) ............... 95131279 A

(51) Int. Cl.
*G01R 31/02*  (2006.01)
(52) U.S. Cl. .................................................. 324/760
(58) Field of Classification Search .............. 324/158.1, 324/754–765
See application file for complete search history.

(56) References Cited

U.S. PATENT DOCUMENTS

| | | | | |
|---|---|---|---|---|
| 4,172,993 A | * | 10/1979 | Leach | 324/760 |
| 4,820,976 A | * | 4/1989 | Brown | 324/760 |
| 6,351,134 B2 | * | 2/2002 | Leas et al. | 324/765 |
| 6,468,098 B1 | * | 10/2002 | Eldridge | 439/197 |
| 6,891,385 B2 | * | 5/2005 | Miller | 324/760 |
| 6,906,543 B2 | * | 6/2005 | Lou et al. | 324/754 |
| 7,235,992 B2 | * | 6/2007 | Liu et al. | 324/760 |

FOREIGN PATENT DOCUMENTS

| | | |
|---|---|---|
| JP | 6-163657 A | 6/1994 |
| JP | 2000-241454 A | 9/2000 |
| KR | 10-2006-0011792 A | 2/2006 |

* cited by examiner

*Primary Examiner*—Ha Tran T Nguyen
*Assistant Examiner*—Joshua Benitez
(74) *Attorney, Agent, or Firm*—Connolly Bove Lodge & Hutz LLP

(57) ABSTRACT

A probing apparatus for integrated circuit devices comprises a probe card, a probe holder for holding the probe card, a test head and a temperature-adjusting mechanism. The probe card comprises at least one probe capable of forming an electrical connection with the integrated circuit device facing a first surface of the probe card, and the temperature-adjusting mechanism can be positioned on/above a second surface of the probe card. The temperature-adjusting mechanism can be positioned inside the probe card, inside the probe holder or on the probe holder. The test head comprises a plurality of pins configured to form electrical connections with connecting sites of the probe card and test and measurement units and apparatus. The temperature-adjusting mechanism can be positioned on or inside the test head. The temperature-adjusting mechanism comprises a flow line having at least one inlet and a plurality of outlets, and the outlets can be positioned on the second surface of the probe card.

8 Claims, 10 Drawing Sheets

INTEGRATED CIRCUIT PROBING APPARATUS HAVING A TEMPERATURE-ADJUSTING MECHANISM

BACKGROUND OF THE INVENTION (A) Field of the Invention

The present invention relates to an integrated circuit probing apparatus having a temperature-adjusting mechanism, and more particularly, to an integrated circuit probing apparatus having a temperature-adjusting mechanism to transfer heat into or out of the testing environment by pressurized fluid.

(B) Description of the Related Art

FIG. 1 and FIG. 2 illustrate a probe card 10 used for testing electrical properties of an integrated circuit device 36 according to the prior art. The probe card 10 comprises a circuit board 12, a circular supporter 14 positioned on the circuit board 12, and a plurality of probes 16 positioned on the circular supporter 14 by epoxy resin 24. The probes 16 are electrically connected to conductive wires 18 on the back surface of the circuit board 12 via channels 20 inside the circuit board 12.

Referring to FIG. 2, a semiconductor wafer 30 is positioned on a wafer chuck 32 with a heater 34. The wafer chuck 32 will rise during testing so that the tip of the probe 16 can contact a pad 38 of integrated circuit devices 36 of the semiconductor wafer 30. During the testing processes, such as the reliability test of the integrated circuit device 36, the heater 34 heats the semiconductor wafer 30, and heat is transmitted to the test environment where the probe card 10 is positioned by thermal radiation or by thermal conduction through the tip of the probe 16, i.e., the temperature of the test environment increases. The increasing temperature causes the physical or material properties of parts or mechanisms in the test environment to change, for example the thermal expansion property causes the material to strain. As a result, the increasing temperature may interrupt the testing or influence the accuracy of the test. In addition, the heat transfer into or out of a test head above the circuit board 12 may also influence the temperature range at which the test instruments or parts within the test head to give results of lower accuracy due to test being carried out in a temperature outside the specification of the test units.

SUMMARY OF THE INVENTION

One aspect of the present invention provides an integrated circuit probing apparatus having a temperature-adjusting mechanism to transfer heat into or out of the testing environment by pressurized fluid.

An integrated circuit probing apparatus according to this aspect of the present invention comprises a probe card having a circuit board, a holder configured to support the probe card, a test head and a temperature-adjusting mechanism. The probe card includes at least one probe positioned on the circuit board, the probe can form an electrical connection with an integrated circuit device facing a first surface of the circuit board, and the temperature-adjusting mechanism can be optionally positioned on a second surface of the circuit board. In addition, the temperature-adjusting mechanism can also be optionally positioned inside the circuit board, inside the holder or on the holder. The test head includes a plurality of pins capable of forming electrical connections with a plurality of connecting sites on the second surface of the circuit board and test instruments or circuitry within the test head for performing the measurements of electrical properties of the device under tests. The temperature-adjusting mechanism can be optionally positioned inside the test head or on the test head. The temperature-adjusting mechanism includes at least one flow line having at least one fluid inlet and a plurality of fluid outlets, the fluid inlet can be positioned on the second surface of the circuit board, and the fluid is gas, liquid or the combination thereof.

Compared to the prior art, the present invention allows the flow of the pressurized fluid in the flow line to adjust the temperature of the test environment. Consequently, the temperature of the test environment where the integrated circuit probing apparatus is positioned can be kept within the range in which the material of the integrated circuit probing apparatus can optimally perform. In addition, variations in the physical or material properties of the test and measurement units, parts and mechanisms of the integrated circuit probing apparatus can be reduced to a minimum by controlling the temperature of the pressurized fluid and the flow rate of the pressurized fluid to decrease the temperature variation of the test environment.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
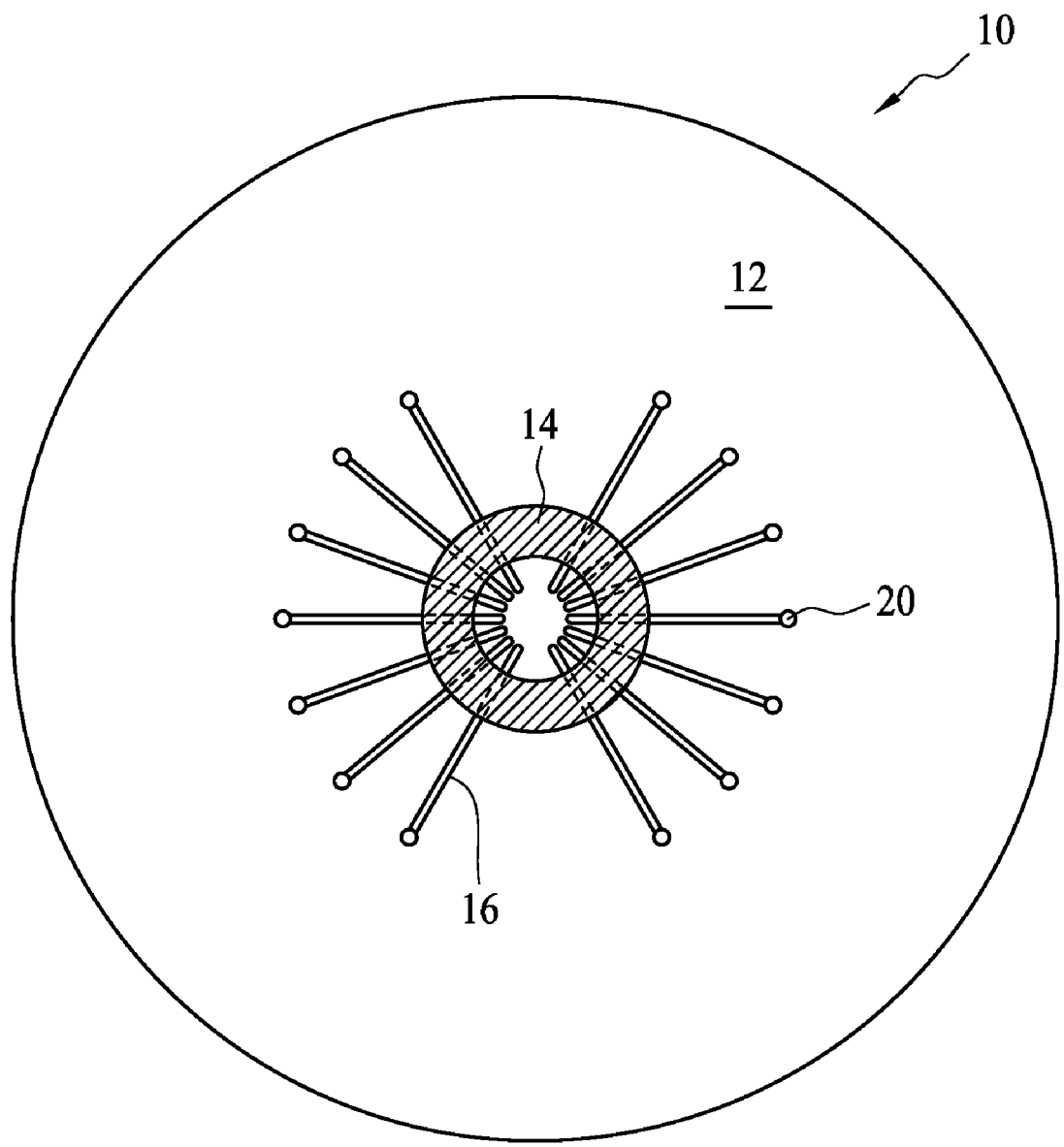
FIG. 1 and FIG. 2 illustrate a probe card used for testing electrical properties of an integrated circuit device according to the prior art.
Figure 2:
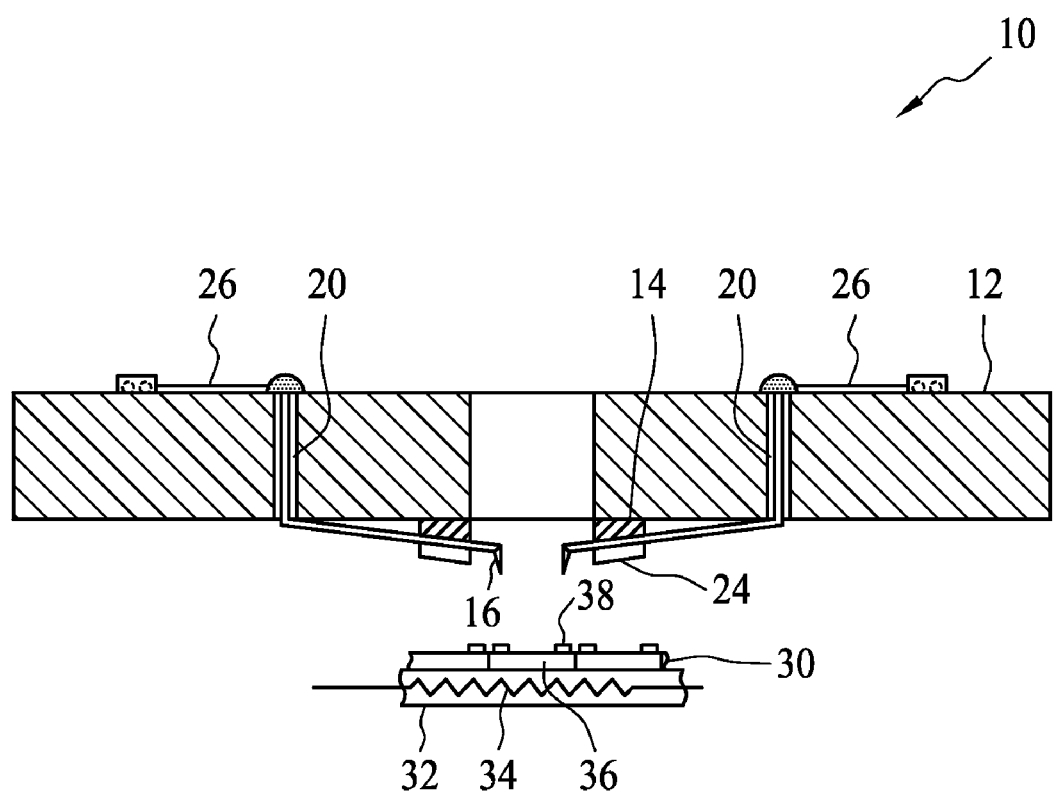
Figure 3:
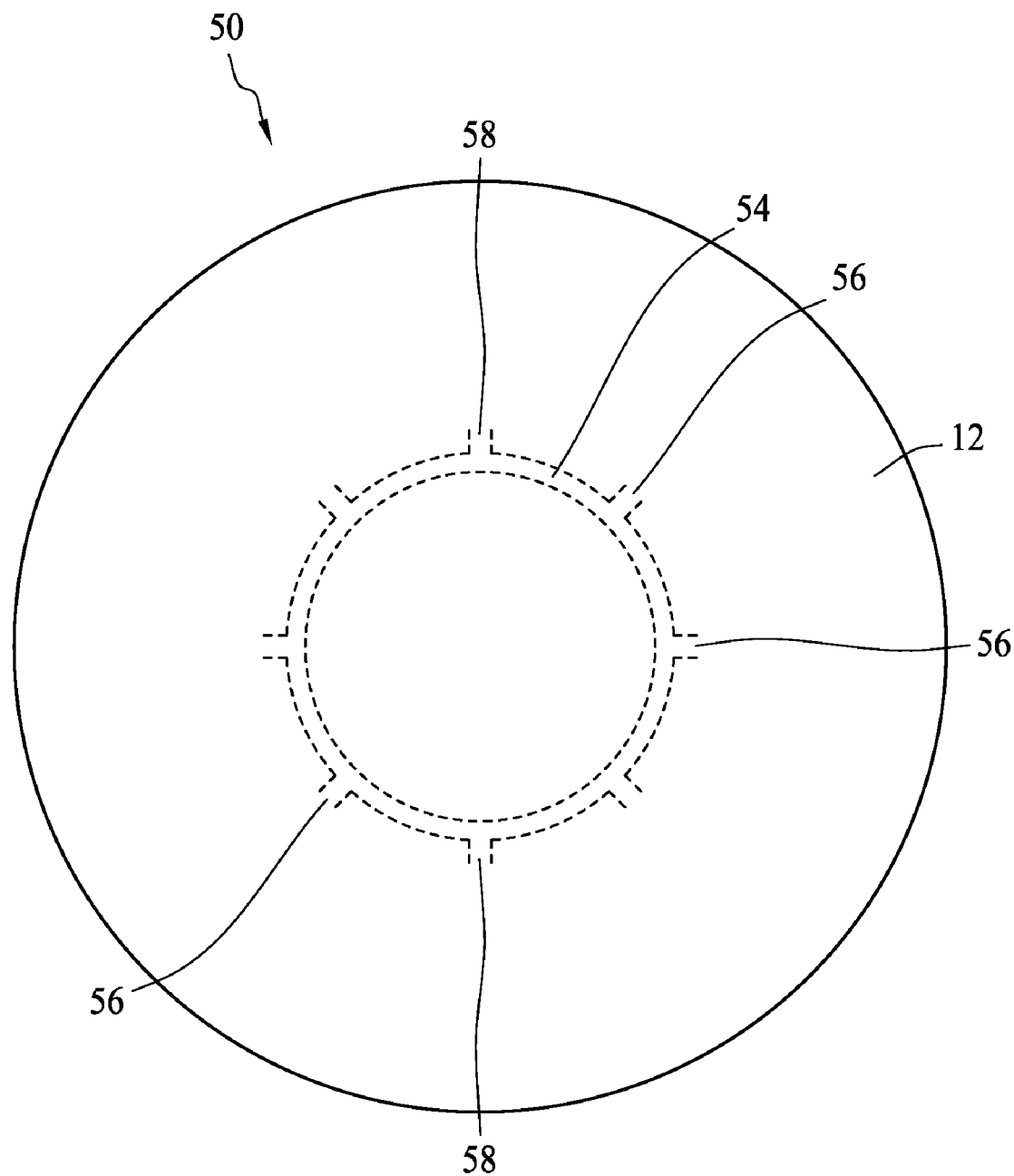
FIG. 3 and FIG. 4 illustrate an integrated circuit probing apparatus according to the first embodiment of the present invention.
Figure 4:
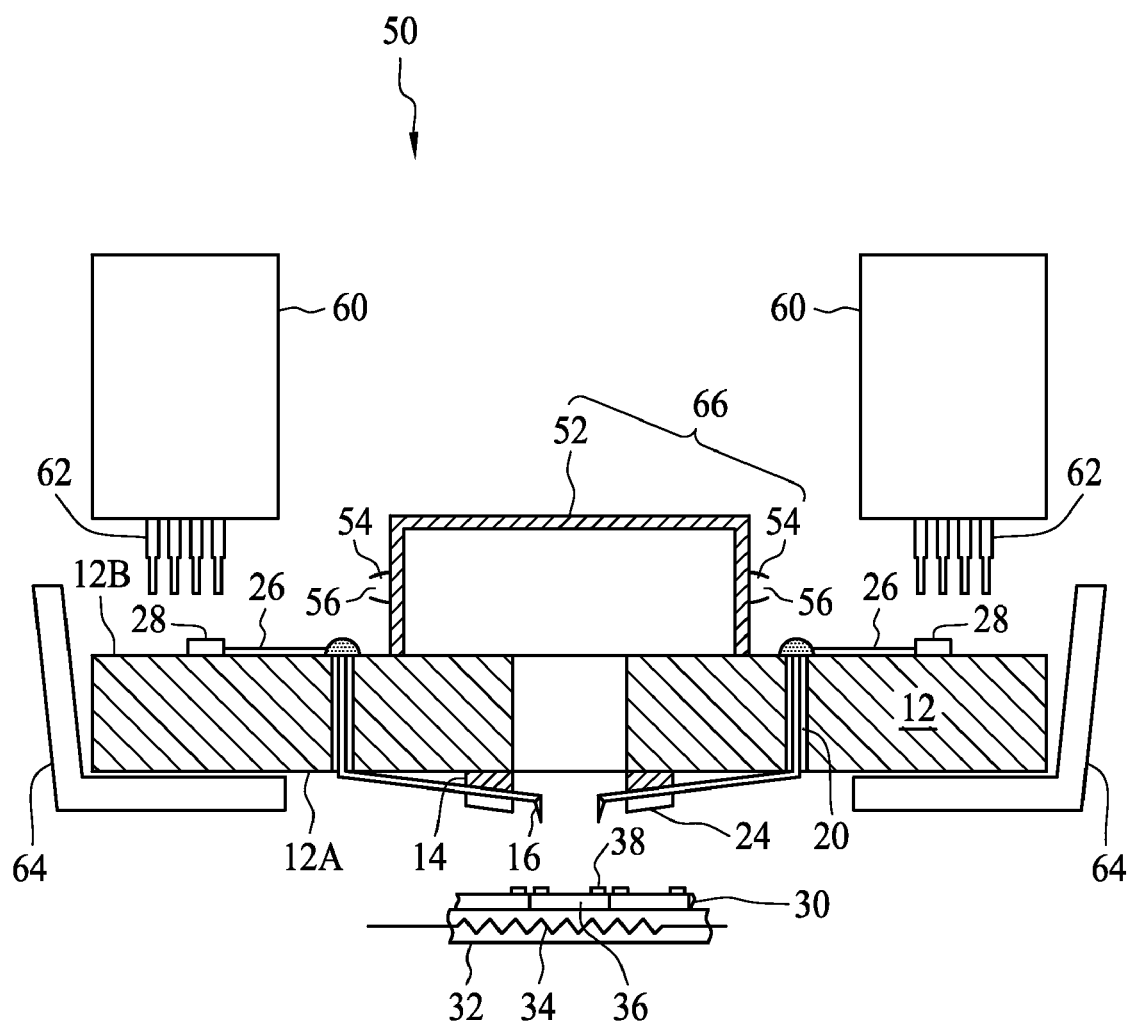

FIG. 3 and FIG. 4 illustrate an integrated circuit probing apparatus 50 according to the first embodiment of the present invention. The integrated circuit probing apparatus 50 comprises a probe card 10, a temperature-adjusting mechanism 66 configured to adjust the temperature of the test environment, a holder 64 configured to support the probe card 10, and a test head 60. The probe card 10 includes a circuit board 12 and a plurality of probes 16 positioned on the circuit board 12. The circuit board has a first surface 12A and a second surface 12B, and the probe 16 can form an electrical connection with an integrated circuit device 30 facing a first surface 12A of the circuit board 12. The test head 60 includes a plurality of pogo pins, connection pins, test interfaces and test measurement units 62 capable of forming electrical connections and measurements with a plurality of connecting sites 28 on the second surface 12B of the circuit board 12.

The temperature-adjusting mechanism 66 comprises a support 52 such as a cover positioned on the second surface 12B of the circuit board 12 and a flow line 54 positioned on the supporter 52. Preferably, the flow line can be a guiding tube having at least one fluid inlet and a plurality of fluid outlets facing the outer edge of the circuit board 12. The flow line permits a fluid to flow therein, and the fluid can be gas, liquid or the combination thereof. For example, the fluid can be cooled dry air, nitrogen or the combination of cooled dry air and nitrogen for cooling the test environment. In addition, the fluid can be heated air for increasing the temperature of cold temperature environment to prevent condensation on the test head 60 and pogo pins 62.

The temperature-adjusting mechanism 66 permits a pressurized fluid to flow therein via the fluid inlet 58 in a controlled manner such that the temperature of the test environment can be kept within a predetermined range in which the material of the integrated circuit probing apparatus 50 can optimally perform. Variations in the physical or material properties of the integrated circuit probing apparatus 50 can be reduced to a minimum by controlling the temperature of the pressurized fluid and the flow rate of the pressurized fluid in order to decrease the temperature variation of the test environment.

The accuracy of the test data of the integrated circuit are determined by the test equipment operating under pre-specified range of working temperature. The temperature-adjusting mechanism 66 is also used to ensure that the test head 60 and pogo pins 62 are performing the electrical measurements of integrated circuit under the specified operation temperature.

Figure 5:
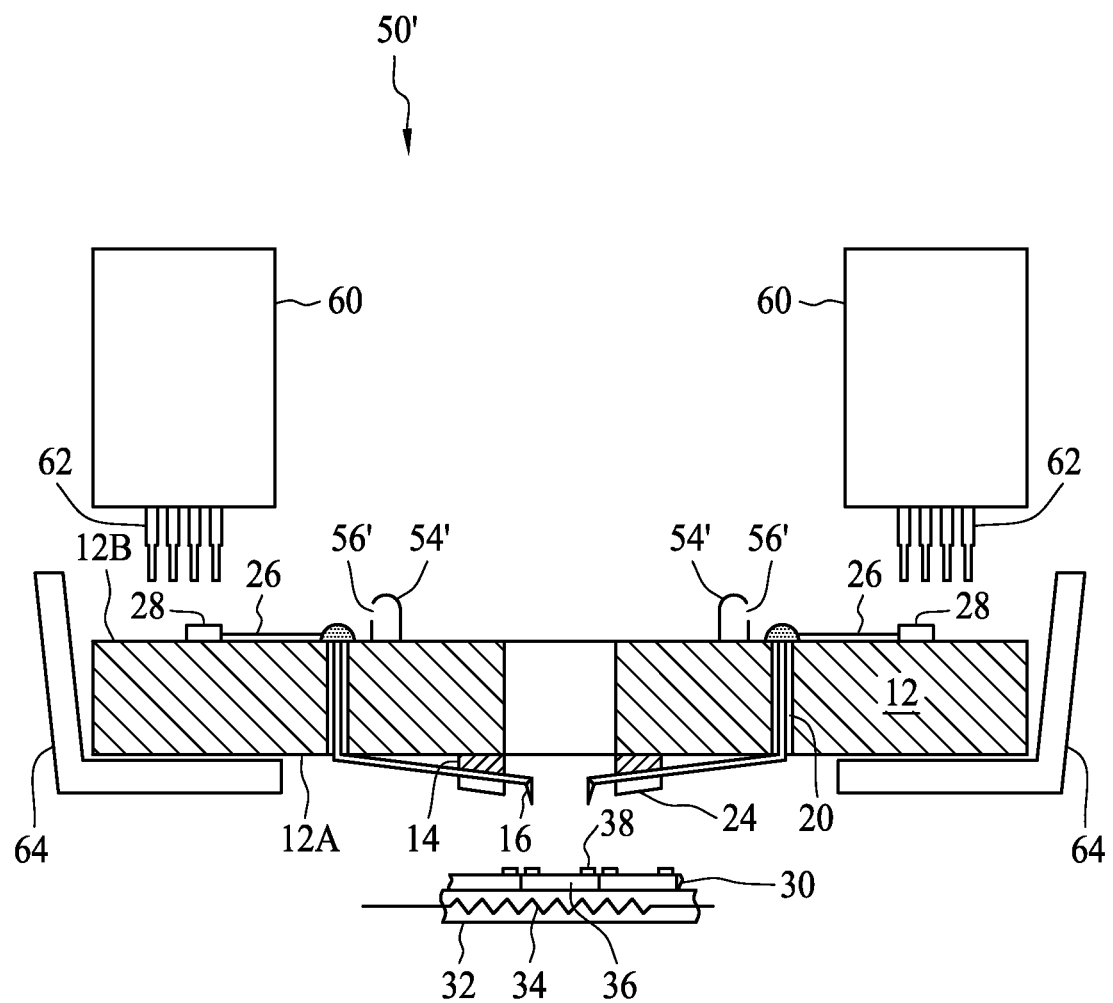
FIG. 5 illustrates an integrated circuit probing apparatus according to the second embodiment of the present invention.

FIG. 5 illustrates an integrated circuit probing apparatus 50' according to the second embodiment of the present invention. Compared to the integrated circuit probing apparatus 50 in FIG. 4 having the flow line 54 on the supporter 52 on the second surface 12B, the integrated circuit probing apparatus 50' in FIG. 5 positions its flow line 54', serving as the temperature-adjusting mechanism, on the second surface 12B. The flow line 54' has a plurality of fluid outlets 56 facing the outer edge of the circuit board 12, and the fluid outlets 56 are preferably facing the pins 62 of the test head.

Figure 6:
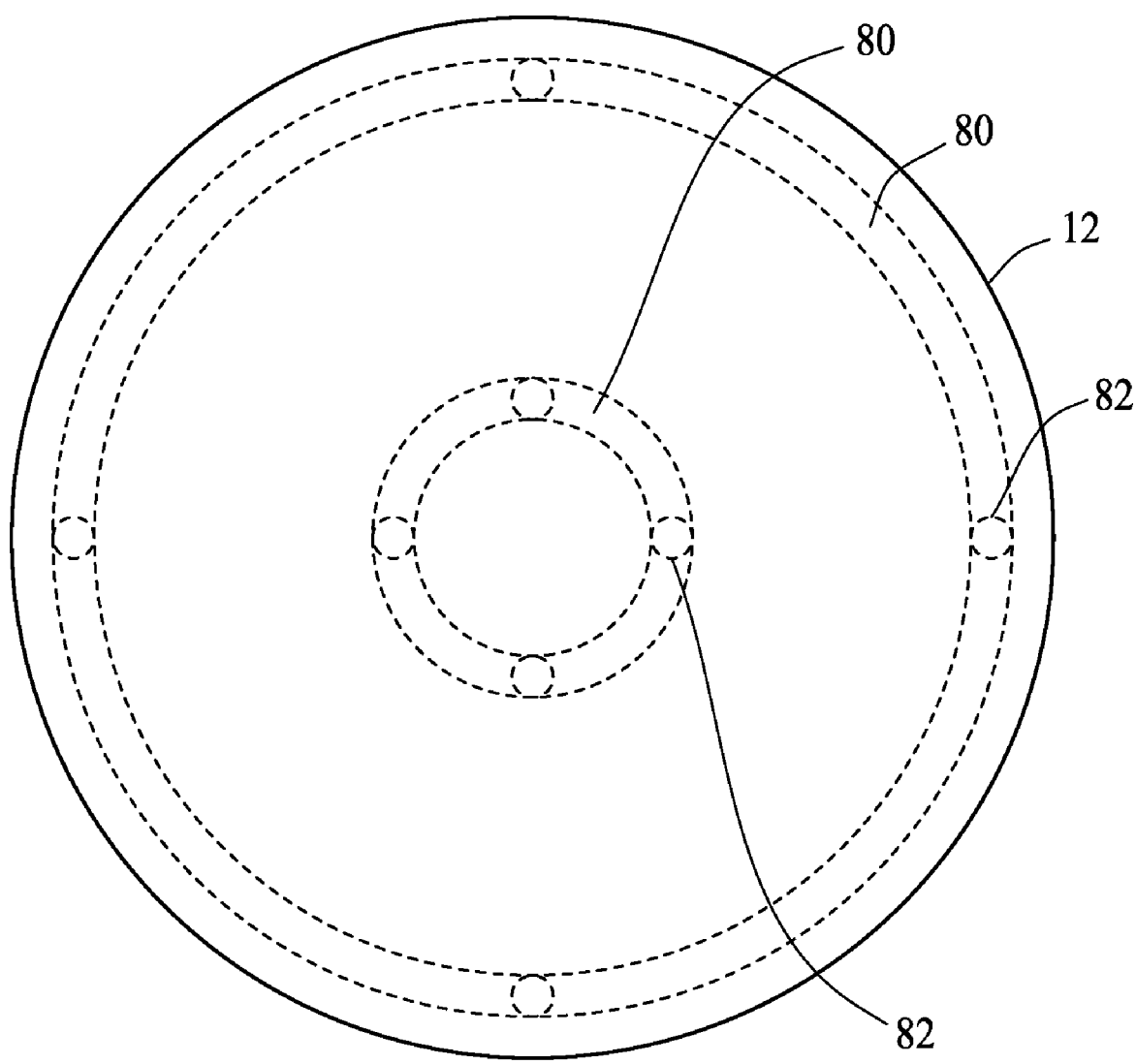
FIG. 6 and FIG. 7 illustrate an integrated circuit probing apparatus according the third embodiment of the present invention
Figure 7:
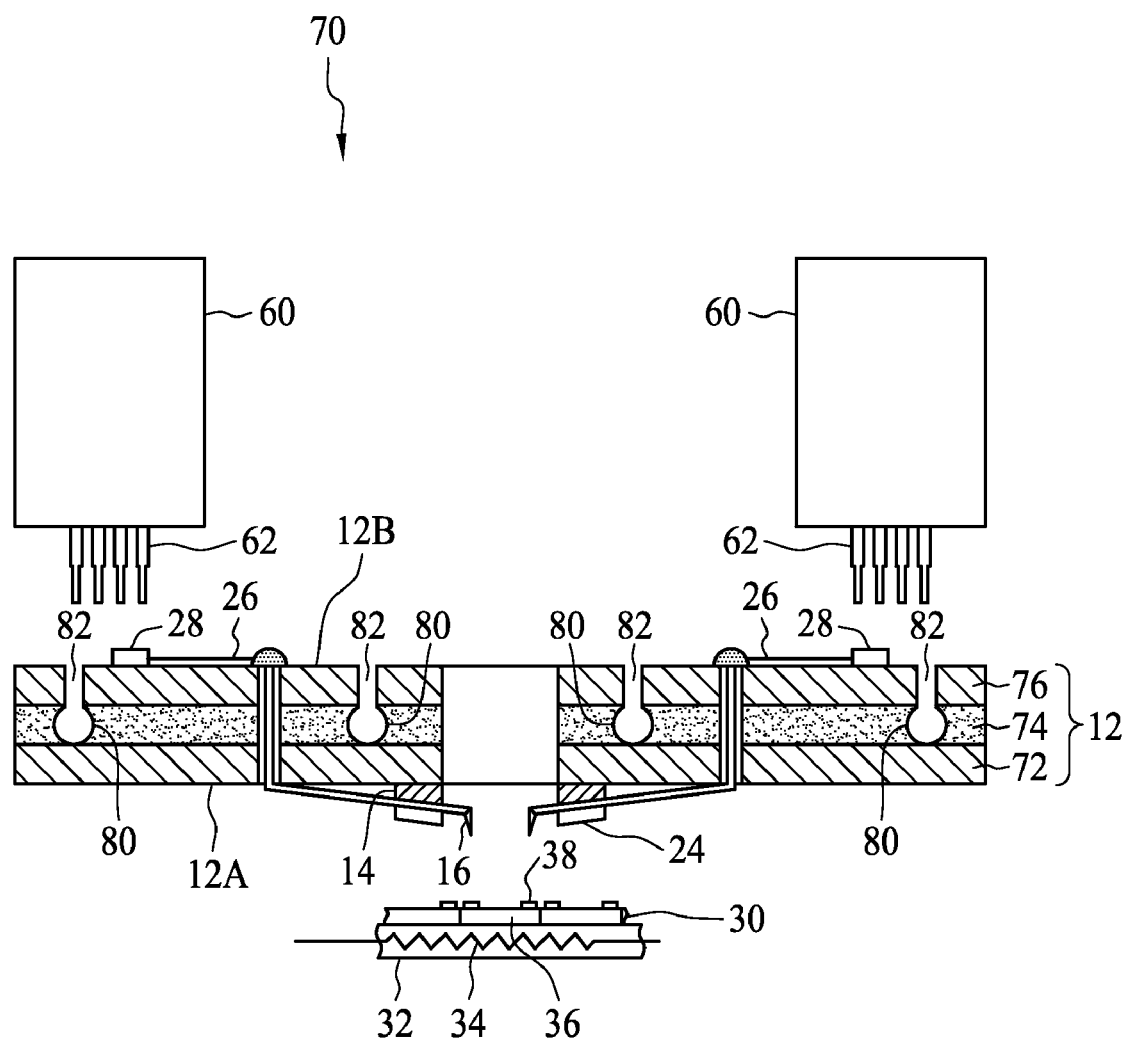

FIG. 6 and FIG. 7 illustrate an integrated circuit probing apparatus 70 according to the third embodiment of the present invention. Compared to the integrated circuit probing apparatus 50 and 50' in FIG. 4 and FIG. 5 having the flow line 54 and 54' substantially on the second surface 12B, the integrated circuit probing apparatus 70 in FIG. 7 positions its flow line 80, serving as the temperature-adjusting mechanism, inside the circuit board 12. The circuit board 12 includes a plurality of laminates 72, 74 and 76, and the flow line 80 is positioned in one of the laminates 72, 74 and 76, for example the laminate 74. The flow line 80 includes a plurality of openings 82 facing the second surface 12B of the circuit board 12, and the openings 82 can serve as fluid inlets or fluid outlets.

Figure 8:
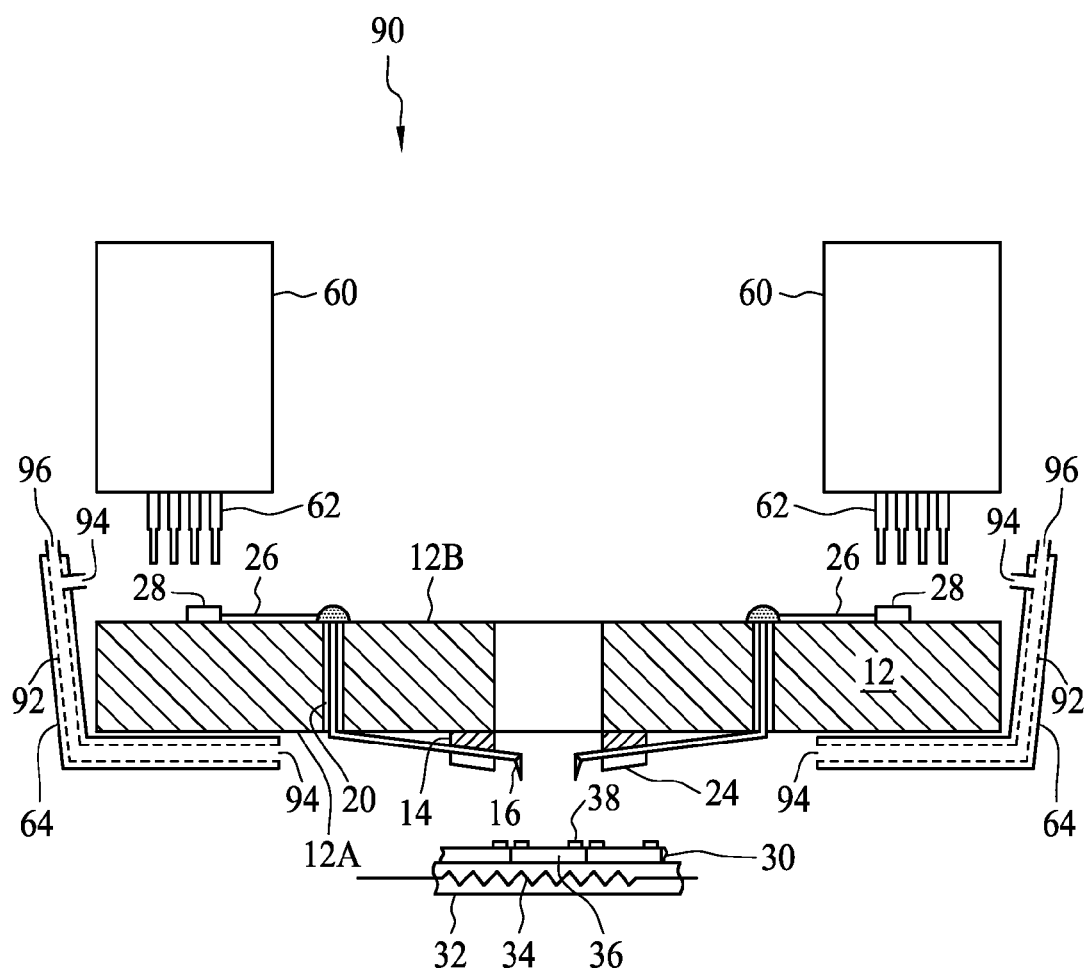
FIG. 8 illustrates an integrated circuit probing apparatus according to the fourth embodiment of the present invention.

FIG. 8 illustrates an integrated circuit probing apparatus 90 according to the fourth embodiment of the present invention. Compared to the integrated circuit probing apparatus 50, 50' and 70 in FIG. 4, FIG. 5 and FIG. 7 having the flow line 54, 54' and 80 on the second surface 12B or inside the circuit board 12, the integrated circuit probing apparatus 90 in FIG. 8 positions its flow line 92, serving as the temperature-adjusting mechanism, inside the holder 64. The flow line 92 has a fluid inlet 96 and a plurality of fluid outlets 94, and the fluid outlets 94 may face the pins 62 of the test head 60 or the first surface 12A of the circuit board 12.

Figure 9:
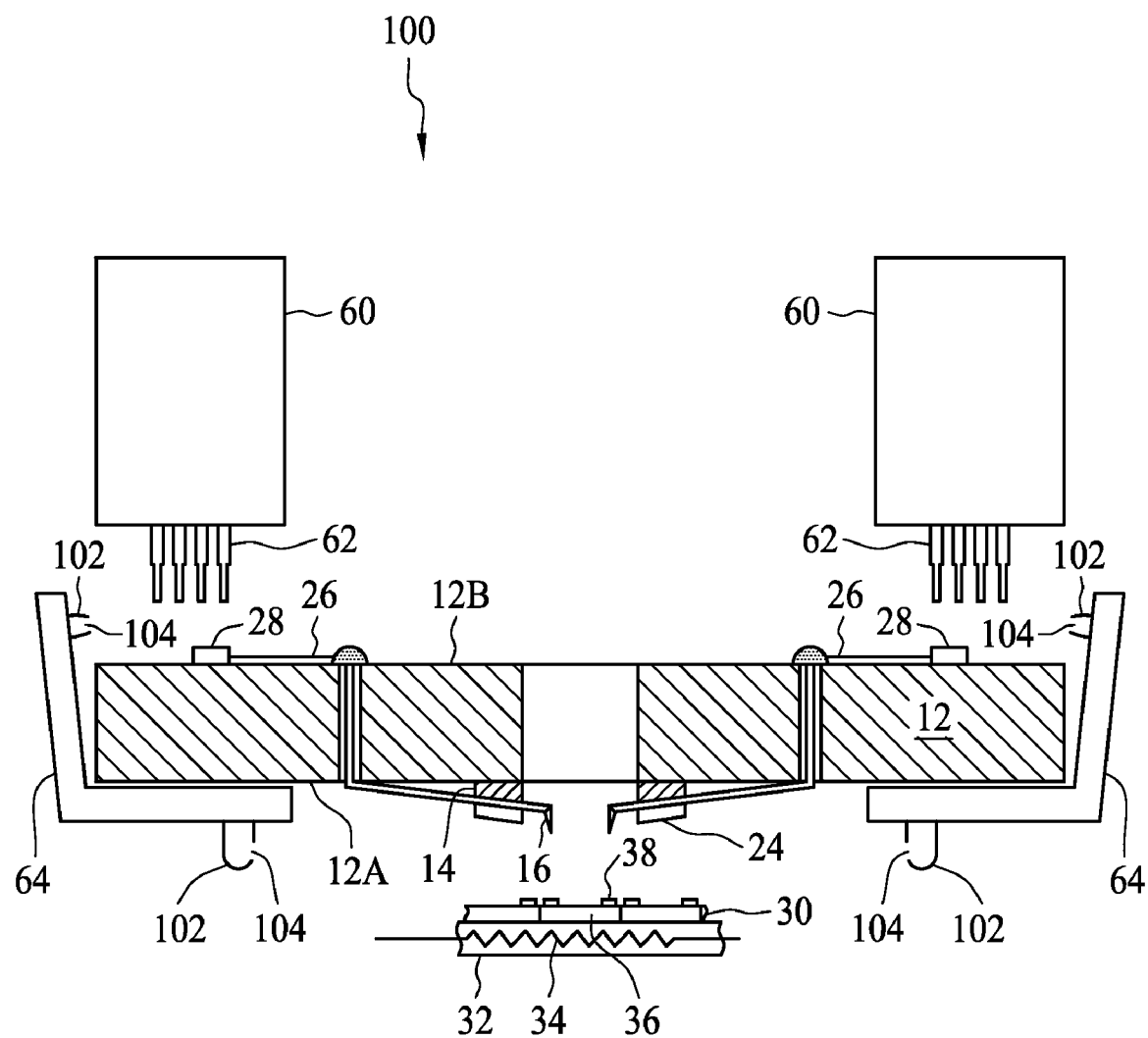
FIG. 9 illustrates an integrated circuit probing apparatus according to the fifth embodiment of the present invention.

FIG. 9 illustrates an integrated circuit probing apparatus 100 according to the fifth embodiment of the present invention. Compared to the integrated circuit probing apparatus 90 in FIG. 8 having the flow line 92 in the holder 64, the integrated circuit probing apparatus 100 in FIG. 9 positions its flow line 102, serving as the temperature-adjusting mechanism, on the holder 64. The flow line 102 has a plurality of openings 104, which can be used as fluid inlets or fluid outlets.

Figure 10:
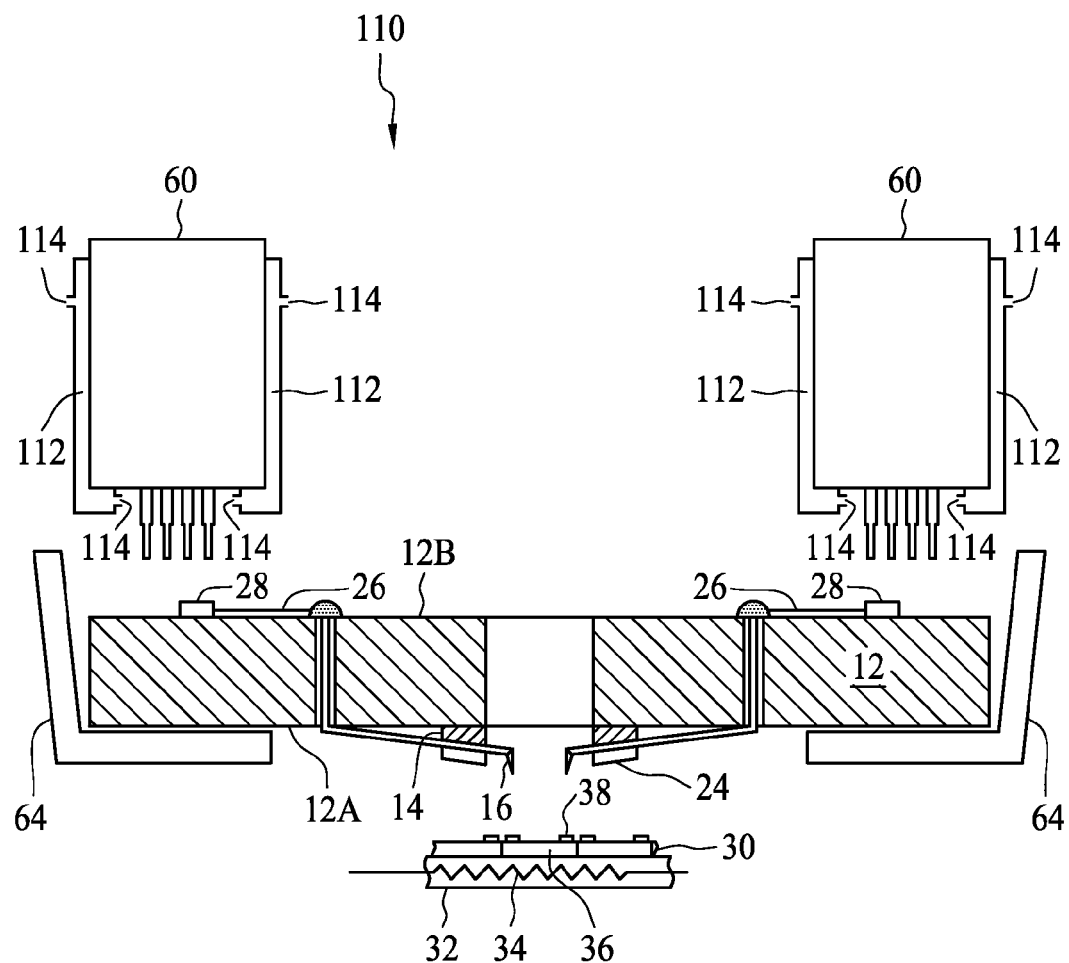
FIG. 10 illustrates an integrated circuit probing apparatus according to the sixth embodiment of the present invention.

FIG. 10 illustrates an integrated circuit probing apparatus 110 according to the sixth embodiment of the present invention. Compared to the aforementioned integrated circuit probing apparatus having the flow line on the circuit board 12 or the holder 64, the integrated circuit probing apparatus 110 in FIG. 10 positions its flow line 112, serving as the temperature-adjusting mechanism, outside the test head 60. The flow line 112 has a plurality of openings 114, which can be used as fluid inlets or fluid outlets. In addition, the flow line 112 can also be positioned inside the test head 60.

Compared to the prior art, the present invention allows the flowing of the pressurized fluid in the flow line to adjust the temperature of the test environment. Consequently, the temperature of the test environment where the integrated circuit probing apparatus is positioned can be kept within the range in which the material of the integrated circuit probing apparatus and the test units of test head can optimally perform. In addition, variations in the physical or material properties of the integrated circuit probing apparatus can be reduced to the minimum by controlling the temperature of the pressurized fluid and the flow rate of the pressurized fluid to decrease the temperature variation of the test environment.

The above-described embodiments of the present invention are intended to be illustrative only. Numerous alternative embodiments may be devised by those skilled in the art without departing from the scope of the following claims.

What is claimed is:

1. An integrated circuit probing apparatus, comprising:
   a circuit board having a first surface and a second surface;
   at least one probe positioned on the circuit board, the probe being configured to electrically contact an integrated circuit device facing the first surface;
   a test head includes a plurality of test measurement units configured to form electrical connections with a plurality of connecting sites on the second surface; and
   a temperature-adjusting mechanism positioned directly on the second surface, having fluid outlets facing pins of the electrical connections of the test head and configured to ensure that the test head and the test measurement units are performing the electrical measurements of the integrated circuit device under a specified operation temperature.

2. The integrated circuit probing apparatus of claim 1, wherein the temperature-adjusting mechanism includes:
   a supporting member positioned on the second surface; and
   at least one flow line positioned on the supporting member.

3. The integrated circuit probing apparatus of claim 2, wherein the flow line includes at least one fluid inlet and a plurality of fluid outlets.

4. The integrated circuit probing apparatus of claim 2, wherein the flow line permits a fluid to flow therein, and the fluid is gas, liquid or the combination thereof.

5. The integrated circuit probing apparatus of claim 2, wherein the flow line is a guiding tube.

6. The integrated circuit probing apparatus of claim 1, wherein the temperature-adjusting mechanism includes at least one flow line positioned on the second surface of the circuit board, and the flow line includes at least one fluid inlet and a plurality of fluid outlets.

7. The integrated circuit probing apparatus of claim 6, wherein the flow line permits a fluid to flow therein, and the fluid is gas, liquid or the combination thereof.

8. The integrated circuit probing apparatus of claim 6, wherein the flow line is a guiding tube.

* * * * *